United States Patent [19]

Yao

[11] Patent Number: 5,769,158
[45] Date of Patent: Jun. 23, 1998

[54] INTERFACE PORTION STRUCTURE AND REINFORCING STRUCTURE OF FLEXIBLE THERMAL JOINT

[75] Inventor: Akira Yao, Tokyo, Japan

[73] Assignee: Mitsubishi Denki Kabushiki Kaisha, Tokyo, Japan

[21] Appl. No.: 812,729

[22] Filed: Mar. 6, 1997

[30]    Foreign Application Priority Data

Mar. 28, 1996 [JP] Japan .................................. 8-074611

[51] Int. Cl.$^6$ ........................................................ F28F 7/00
[52] U.S. Cl. .......................... 165/185; 361/704; 165/905
[58] Field of Search .................................... 165/185, 905; 361/704

[56]             References Cited

U.S. PATENT DOCUMENTS

| 5,077,637 | 12/1991 | Martorana et al. | 165/185 X |
| 5,224,030 | 6/1993 | Banks et al. | 165/185 X |
| 5,255,738 | 10/1993 | Przilas | 165/185 |
| 5,287,248 | 2/1994 | Montesano | 361/708 |
| 5,390,734 | 2/1995 | Voorhes et al. | 165/185 |

OTHER PUBLICATIONS

A.A.M. Delil, SAE–87140, "Movable Thermal Joints for Deployable or Steerable Spacecraft Radiator Systems," *Society of Automotive Engineers, Inc.*, pp. 1–12.

*Primary Examiner*—Allen J. Flanigan
*Attorney, Agent, or Firm*—Burns, Doane, Swecker & Mathis, LLP

[57]               ABSTRACT

An interface portion structure and a reinforcing structure for flexible thermal joints. A member having a high thermal conductivity represented by bundled graphite fibers is used as a thermal conductor for heat transfer from a heat source to a heat sink. The thermal conductor is provided with auxiliary thermal conductors at its interface portions in order to suppress thermal resistance on a face for conducting heat between the thermal conductor and the heat source or heat sink, and a conduction cross-sectional area is increased by the auxiliary thermal conductors. To suppress thermal resistance, a heat conduction face is cut slantwise or metallized, and adhesive agent is disused.

9 Claims, 8 Drawing Sheets

INTERFACE PORTION STRUCTURE AND REINFORCING STRUCTURE OF FLEXIBLE THERMAL JOINT

BACKGROUND OF THE INVENTION a) Field of the Invention

The invention relates to a flexible thermal joint.

b) Description of the Related Art

FIG. 25 shows a thermal joint 10 disclosed in "Moveable Thermal Joint for Deployable or Steerable Spacecraft Radiator System", A. A. M. Delil, SAE-871460. The thermal joint 10 includes a thermal conductor 12 formed of carbon fibers 12a bound into a bundle as shown in FIG. 26, and heat is conducted in the longitudinal direction of the bundle of the carbon fibers 12a inside the thermal conductor 12. As shown in FIG. 25, the thermal joint 10 has a pair of attachments 14 to fix the thermal conductor 12 to a heat source or heat sink. The attachments 14 are fixed to two interface portions 12b of the thermal conductor 12 to tie interface portions 12b. Therefore, the thermal conductor 12 is bendable at any part of a portion 12c owing to the flexibility of the carbon fibers 12a. In the following description, one of the two interface portions 12b, that one which receives heat from the heat source, is referred to as a source interface, and the other, which supplies heat to the heat sink, is referred to as a sink interface. Also, the portion 12c is also referred to as a flexible portion. To transfer heat from a heat source 18 to a heat sink 20, the thermal joint 10 is fixed to the heat source 18 and the heat sink 20 by the attachments 14 and an adhesive agent 16 as shown in FIG. 27 and FIG. 28. FIG. 27 shows a state that the thermal conductor 12 is not bent, and FIG. 28 shows that the thermal conductor 12 is bent. Since the carbon fibers 12a of the thermal joint 10 are very flexibile, heat can be transferred in a desired direction by bending the thermal conductor 12.

The carbon fibers 12a may be replaced by, e.g., metal wires to form a flexible thermal joint. However, a metal such as silver has a thermal conductivity of 419 W/(m·K), while the carbon fibers 12a, e.g., graphite fibers (graphitized carbon fibers), have a thermal conductivity of 600 W/(m·K) or more. Therefore, by using carbon fibers 12a formed of graphite fibers, heat can be transferred from the heat source 18 to the heat sink 20 more efficiently than when metal fibers formed of silver are used. In other words, it is possible to suppress a difference between a temperature on a portion where the thermal joint 10 is in contact with the heat source 18 through the adhesive agent 16 and a temperature on a portion where the thermal joint 10 is in contact with the heat sink 20 through the adhesive agent 16. The same effects can also be obtained by using a carbon fiber plate formed by filling and curing in bundled carbon fibers, carbon fiber threads formed by twining carbon fibers, carbon fiber fabrics formed by weaving carbon fibers, or carbon fibers formed by braiding instead of the bundled carbon fibers shown in FIG. 26. In the present invention, "carbon fiber thermal conductor" is used to indicate various types of thermal conductors which are formed of carbon fibers and have the direction of thermal conduction defined by the arranged direction of carbon fibers, such as the above bundled carbon fibers, carbon fiber plates, carbon fiber threads, carbon fiber fabrics, and braided carbon fibers.

However, the above prior art has some disadvantages.

First, since the carbon fiber thermal conductor has a high thermal conductivity, heat flow (amount of heat per unit area and unit time) on the surfaces of the interface portions of the carbon fiber thermal conductor is large, causing significant temperature differences between the thermal conductor 12, the attachment 14, and the heat source 18 or the heat sink 20, namely a high thermal resistance between them which suppresses heat transfer efficiency from the heat source 18 to the thermal conductor 12 and vice versa through the adhesive agent 16 (and the attachment 14). Thus, the first disadvantage of the prior art is such a high thermal resistance in the interface portions of the carbon fiber thermal conductor which is particularly noticeable when the attachment 14, the heat source 18, and the heat sink 20 are formed of metal with high thermal conductivity.

The above-described prior art bonds to fix the thermal conductor 12 having a very high thermal conductivity and the heat source 18 and heat sink 20 having a high thermal conductivity but not so high as that of the thermal conductor 12 with the adhesive agent 16 generally having a low thermal conductivity. This adhesive agent 16 having a low thermal conductivity is a very thin layer but interferes with heat transfer. A second disadvantage of the prior art is a high thermal resistance between the thermal conductor 12 and the heat source 18 and heat sink 20 due to the adhesive agent 16 and is particularly noticeable when the heat source 18 and the heat sink 20 are made of metal whose thermal conductivity is relatively high, or the adhesive agent 16 has low thermal conductivity.

Further, the above prior art uses a carbon fiber thermal conductor for the thermal conductor 12. The heat conduction within the carbon fiber thermal conductor depends on variations in the thermal conductivity of the respective carbon fibers 12a. For Example, when all of the carbon fibers 12a forming the carbon fiber thermal conductor have a nearly uniform thermal conductivity, efficient heat conduction should be expected, but actually since the carbon fibers 12a forming the carbon fiber thermal conductor have variations in their thermal conductivitics, the average thermal conductivity of the carbon fiber thermal conductor as a whole is generally lowered, thus lowering heat transfer efficiency. A third disadvantage of the prior art is that the carbon fibers 12a have variations in thermal conductivities, leading to an obstruction to the improvement of a heat transfer efficiency. Especially, when a large crystal structure is produced by graphitizing fibers in order to improve thermal conductivity, the heat conduction is readily varied due to the large crystal structure. Namely, even when a large crystal structure is formed in order to improve the thermal conductivity and the heat transfer efficiency, the variations in heat conduction due to the large crystal structure obstructs the improvement of the heat transfer efficiency.

In addition, since the above prior art uses bundled carbon fibers having a relatively low mechanical strength for the thermal conductor 12, the thermal conductor 12 may be broken when a large load is applied. For example, loads to be applied to the thermal conductor 12 are caused by a stress which is applied especially at the interface portion 12b from the attachment 14 to the thermal conductor 12 when the thermal joint 10 is bent, or by a difference in coefficient of thermal expansion between the thermal conductor 12 and the attachment 14, adhesive agent 16, heat source 18, or heat sink 20. Such loads are hardly unavoidable because of uses of the flexible thermal joints. One method to prevent the thermal conductor 12 from being broken by the application of such load is improvement of the mechanical strength of the thermal conductor 12 realized by: mutually adhering and sealing with resin, twining, weaving, or braiding the carbon fibers 12a. By using products obtained according to the above methods, namely the above-described carbon fiber plate, carbon fiber thread, carbon fiber fabric, or braided carbon fibers, for the thermal conductor 12, the mechanical strength of the thermal conductor 12 is improved to some extent by the resin used to adhere the carbon fibers 12a or the mutual intertwinement (twining, weaving or braiding) of the carbon fibers 12a. However, the mechanical strength improvement bv such arrangements is not sufficient to resist against a load caused due to the above various factors. In summary, a fourth disadvantage of the prior art is the low mechanical strength of the thermal conductor 12 which is particularly prominent when the carbon fibers 12a have a large crystal structure, resulting in relatively high thermal conductivity, but poor mechanical strength. Further, this disadvantage obstructs the use of the thermal joint 10 on a sliding part or a complex-configured part in equipment used in space and rarely performed maintenance, equipment for aircraft used in a hostile environment, equipment for plants where it is desired to decrease the frequency of maintenance or repair as much as possible, or equipment for home use which is desired not to require frequent maintenance or repair.

SUMMARY OF THE INVENTION

A first object of the invention is to lower a thermal resistance between a heat source and a thermal conductor and between the thermal conductor and a heat sink. The invention achieves the first object by improving the structures of a source interface portion and a sink interface portion of the thermal conductor. A second object of the invention is to solve a low heat transfer efficiency due to variations in thermal conductivity within the thermal conductor. The invention achieves the second object by modifying the structures of the source interface portion and the sink interface portion of the thermal conductor, changing the materials forming the thermal conductor, or combining modification and change. A third object of the invention is to make it possible to improve the mechanical strength of the thermal conductor without changing the material for the thermal conductor itself. The invention achieves the third object by adding or improving a member for supporting the thermal conductor.

A preferred embodiment according to the invention relates to a thermal joint for transferring heat between external substances (e.g., from a heat source to a heat sink), which is provided with an auxiliary conductor in addition to a main conductor. The main conductor is a member for transferring heat between the external substances and has flexibility in a direction crossing to a direction in that heat is transferred. In this embodiment, there are at least two paths for the heat conduction between the external substances and the main conductor. A first path is from the external substances to the interface portion of the main conductor and view versa. A second path is from the external substances to the main conductor through the auxiliary conductor and vice versa. One of the features of this embodiment is an auxiliary conductor providing a second path. According to the structure of this embodiment which can provide both first and second paths, a thermal resistance between the external substances and the main conductor is lower than a conventional structure which provides the first path only. Besides, by providing a second path, a complexed path formed of the first and second paths is also provided. One example of the complexed pass is a third path from a given portion of the main conductor to another given portion of the main conductor through the auxiliary conductor. The third path serves to relieve variations in heat conduction within the main conductor.

The main conductor and the auxiliary conductor in the embodiment are not limited to any particular number. However, when a plurality of main conductors and a plurality of auxiliary conductors are alternately laminated at interface portions of the main conductors in a direction crossing a direction of heat transfer in the main conductors, the following additional advantages can be obtained. First, by using the above mentioned a laminated structure, the above second and third paths are formed in great numbers and various types, and variations in heat conduction within the main conductors are thereby relieved. Second, as a complexed path of the first and second paths, a fourth path from one main conductor to another main conductor through the auxiliarv conductor is obtained. The fourth path also serves to relieve variations in heat conduction between the main conductors. The same effect can be obtained by a unified structure which is formed of a plurality of main conductors and a plurality of auxiliary conductors unified at the interface portions of the main conductors. The unified structure has advantages that attachments can be attached easily as compared with case that the attachments are attached to the laminated structure.

Materials for the main conductor and the auxiliary conductor may be, for example, bundled fibers formed by bundling a plurality of fibers having a thermal conductivity, such as carbon fibers and metal fibers. By using a resin plate formed by adhering the bundled fibers with a resin instead of the bundled fibers, mechanical strength of the main conductor increases. Futher, a plurality of fibers having a thermal conductivity such as carbon fibers or metal fibers may be twined, woven into other fibers, or interwoven, and the thus-obtained products, namely the thermal threads, thermal fibers and thermal braided fabrics can also be used as the main conductor, thereby obtaining higher mechanical strength than the simply bundled fibers. In addition, when thermal foils having a thermal conductivity, such as metal foils and carbon foils or thermal plates having a thermal conductivity such as metal plates, are used for the main conductor and the auxiliary conductor, since the restriction of direction of heat propagation within various types of thermal conductors formed of thermal fibers, such as a carbon fiber thermal conductor does not appear, variations in heat conduction within the main or auxiliary conductors can be lowered. Note that such foils or plates must have sufficient flexibility to be use as the main conductor. The unified structure may be used in which bulk-formed products for fixing the main conductors to each other at the interface portions to form a space between the respective main conductors in a direction crossing to a direction of heat transfer through the main conductors are used as auxiliary conductors. More specifically, the unified structure can be provided by fixing the interface portions of the mutually spaced main conductors with carbon or metal serving as the above-described auxiliary conductor.

To further lower thermal resistance between the main conductor and the external substances, other improvements may be made to the embodiment. In a first improving method, slantwise cut faces are provided at end portions of at least one of the main conductors and the auxiliary conductors to conduct heat from or to the external substances with respect to the direction of heat transfer in the main conductors, thereby making the area for heat conduction with the external substances larger than the cross sectional area of the main conductor or the auxiliary conductor. Thus, thermal resistance is lowered. In a second improving method metallized faces are provided at the end portions of at least one of the main conductors and the auxiliary conductors to conduct heat from or to the external substances, enabling the faces to be fixed to an external substance, generally formed of metal, by melt-bonding the metal forming the face or another type of metal. Therefore, since it is not necessary to use an adhesive agent, the increase of a thermal resistance due to a low thermal conductivity of the adhesive agent can be avoided. These first and second improving methods are preferably used together. The first improving method and the second improving method can be applied without any modification to a thermal joint not provided with an auxiliary conductor, e.g., the thermal joint of the prior art, and works to lower a thermal resistance.

To enhance the mechanical strength a method in which a reinforcing member having flexibility in a direction substantially parallel to the direction of flexibility of the main conductor is attached to the main conductor and the auxiliary conductor to bridge over the main conductor from one to the other of the interface portions can be used. By using such a reinforcing member, a load to be applied to the main conductor when the flexible part of the main conductor is bent or a load to be applied to the main conductor due to a thermal stress can be diverted to the reinforcing member, so that the main conductor is not readily broken due to such a load, even when the main conductor has a large crystal structure. Further, as a member for attaching the reinforcing member to the main conductor and the auxiliary conductor, an attachment used for the prior art can also be used.

DETAILED DESCRIPTION OF THE PREFERRED EMBODIMENTS

Figure 1:
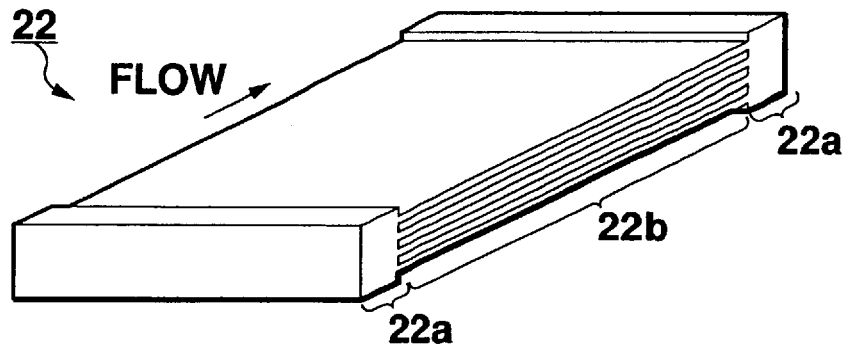
FIG. 1 is a perspective view showing the appearance of a thermal joint, particularly its thermal conductor, according to a preferred embodiment of the invention.

Preferred embodiments of the invention will be described with reference to the accompanying drawings. Like reference numerals indicate like members common throughout the embodiments and repeated descriptions will be omitted. Further, a thermal joint for transferring heat between two external substances will be described below, but it is to be understood that the invention can also achieve a thermal joint for transferring heat among three or more external substances, namely thermal joint for transfering heat between three or more heat sources sinks. Referring to the disclosure of the invention, such variations may be made without difficulty bv those skilled in the art.

Figure 2:
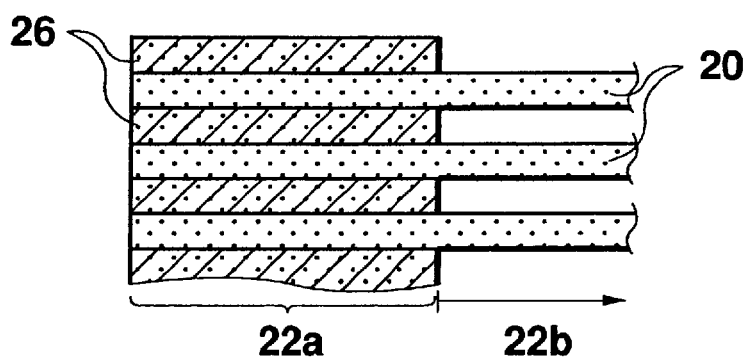
FIG. 2 is a partially cutaway sectional view showing an example when the source interface portion or sink interface portion of a thermal conductor is achieved by a laminated structure of main conductors and auxiliary conductors.
Figure 3:
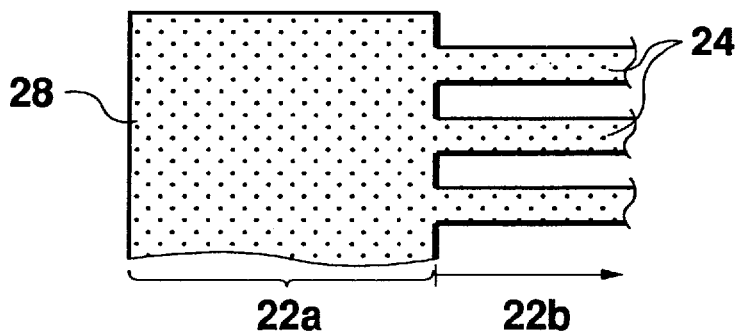
FIG. 3 is a partially cutaway sectional view showing an example when the source interface portion or sink interface portion of a thermal conductor is achieved by a unified structure of main conductors and auxiliary conductors.

FIG. 1 shows the appearance of a thermal joint, particularly its thermal conductor 22, according to one embodiment of the invention. The thermal conductor 22 has two interface portions 22a and a portion 22b held between the interface portions 22a. One of the two interface portions 22a is a portion for receiving heat from a heat source, namely a source interface, and the other is a portion for supplying heat to a heat sink, namely a sink interface. The portion 22b is a thermal conductor for transferring heat from the source interface to the sink interface. The interface portion 22a has a laminated structure formed by alternately laminating a plurality of main conductors 24 and a plurality of auxiliary conductors 26 as shown in FIG. 2. The main conductors 24 extend from one of the interface portions 22a to the other one along the portion 22b shown in FIG. 1. In other words, the main conductor 24 of the thermal conductor 22 is a main material for transferring heat from the heat source to the heat sink. On the other hand, the auxiliary conductors 26, which are laminated with the main conductors 24 in the direction perpendicular to the direction of heat transfer through the main conductors 24, are thermal conductors for equivalently lowering a thermal resistance between the heat source or heat sink and the main conductors 24 and only provided in the two interface portions 22a. In the laminated structure shown in FIG. 2, the main conductors 24 and the auxiliary conductors 26 are made of a different member, but the auxiliary conductors 26 may be integrally formed with the main conductors 24 in a unified structure as shown in FIG. 3. In FIG. 3, reference numeral 28 denotes a conductor formed by unifying the main conductors 24 and the auxiliary conductors 26.

Figure 4:
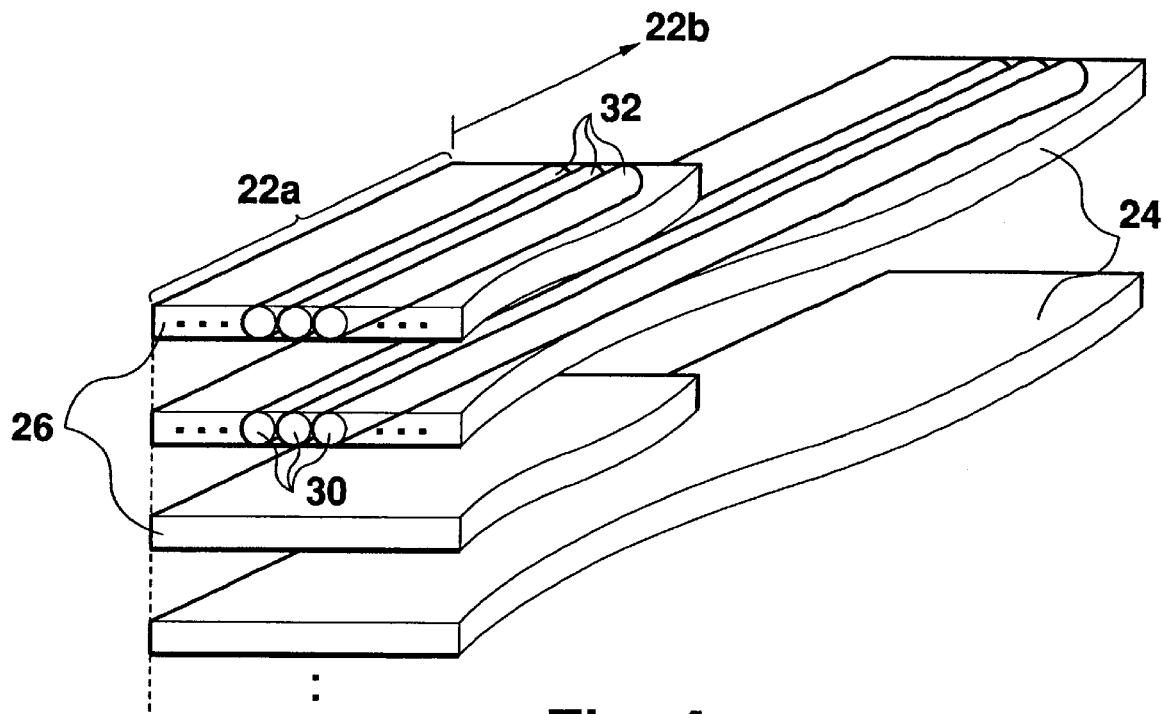
FIG. 4 is a partially cutaway exploded perspective view showing the structure of a source interface portion or sink interface portion which has its main or auxiliary conductor formed of a carbon fiber thermal conductor.
Figure 5:
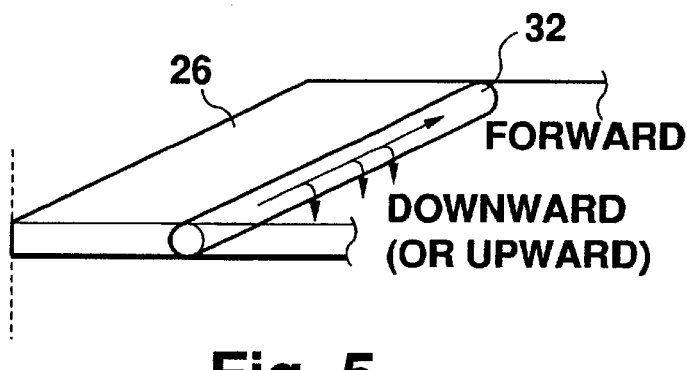
FIG. 5 is a schematic perspective view showing an example of heat conduction within an auxiliary conductor formed of bundled carbon fibers.

FIG. 4 shows an example of achieving the laminated structure shown in FIG. 2 having the main conductors 24 formed of a bundle of carbon fibers 30 and the auxiliary conductors 26 formed of a bundle of carbon fibers 32. The carbon fibers 30, 32 are, for example, graphite fibers having a large crystal structure, namely a high thermal conductivity. By using the above material and structure, various advantages can be provided in addition to the high thermal conductivity of the carbon fibers 30. For example, heat flows from the heat source through not only the main conductors 24, but also through the auxiliary conductors 26 at the source interfaces 22a. Heat flowing through the auxiliary conductors 26 propagates on one hand along the carbon fibers 32 within the auxiliary conductors 26 (FORWARD in FIG. 5) and on the other hand outward through the carbon fibers 32 (DOWNWARD OR UPWARD in FIG. 5), since the carbon fibers 32 within the auxiliary conductors 26 are shorter than the carbon fibers 30 within the main conductors 24 and therefore, the transfer of heat from the carbon fibers 32 to the main conductors 24 occurs at a ratio not negligible with respect to the heat transfer within the carbon fibers 32. Heat transferred from the heat source to the source interface 22a is finally conducted to the thermal conductor 22b through the main conductors 24 regardless of whether it is transferred to the main conductors 24 or the auxiliary conductors 26. The same situation takes place at the sink interface 22b, namely the heat sink side.

Accordingly, when auxiliary conductors 26 are provided as in this embodiment, a conduction cross-sectional area from the heat source to the main conductors 24 and a conduction cross-sectional area from the main conductors 24 to the heat sink are enhanced equivalently as compared with cases without the auxiliary conductors 26. By enhancement of the conduction cross-sectional area, namely the lowering of thermal resistance, the heat transfer efficiency between the heat source and heat sink via the thermal conductor 22 is enhanced. Further, since the heat initially transferred to the auxiliary conductors 26 tends to flow toward portions having a relatively low temperature on the main conductors 24, and variations in heat conduction due to the large crystal structure are hardly significant, even when carbon fibers 30 having a large crystal structure are used. Therefore, the thermal conductivity of the thermal conductor 22 as the whole is increased. Further, a temperature distribution in respective main conductors 24 and a temperature difference between the plurality of main conductors 24 are also relieved by the heat transfer through the auxiliary conductors 26, thus variations in heat conduction can also be relieved in this connection The main conductors 24 and the auxiliary conductors 26 in FIG. 4 are formed of the bundled carbon fibers, but may also be formed of a resin plate produced by bonding a plurality of carbon fibers with a resin, carbon fiber threads formed by twining a plurality of carbon fibers, carbon fiber fabrics formed by weaving a plurality of carbon fibers into other fibers, or braided carbon fibers formed by interweaving carbon fibers, instead of the st bundled carbon fibers. Since they contain a resin or are formed by intertwining the fibers, they have a higher mechanical strength than mere bundled carbon fibers. Further, other kinds of thermal fibers such a s metal fibers ma be used instead of the carbon fibers.

Figure 6:
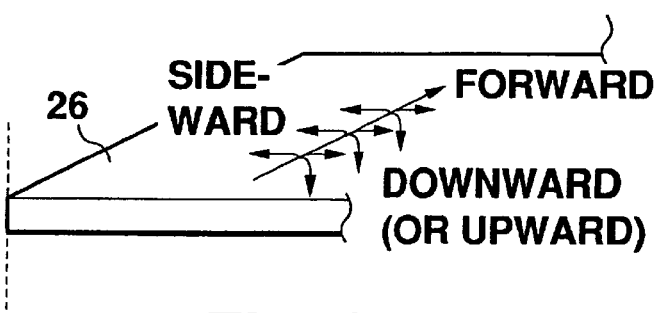
FIG. 6 is a schematic perspective view showing an example of heat conduction within an auxiliary conductor formed of a metal plate.
Figure 7:
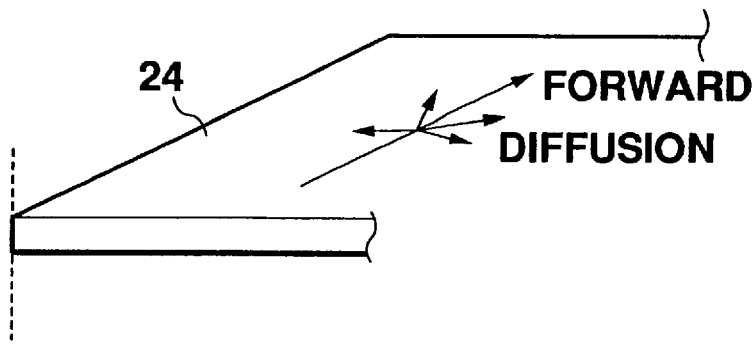
FIG. 7 is a schematic perspective view showing an example of heat conduction within a main conductor formed of a foil.

Furthermore, the main conductors 24 and the auxiliary conductors 26 can also be achieved by using a foil or plate of carbon or metal. Especially when the auxiliary conductors 26 are formed of metal plates, heat is also conducted sideward within the auxiliary conductors 26 (SIDEWARD in FIG. 6), and the effect of suppressing variations in heat conduction within the main conductors 24 by means of the auxiliary conductors 26 be comes more conspicuous. When the main conductors 24 are formed of carbon foils or metal foils, heat is diffused horizontally within the main conductors 24 (DIFFUSION in FIG. 7), variations in heat conduction within the main conductors 24 are further suppress ed. When the main conductors 24 and the auxiliary conductors 26 are formed of metal, differences in coefficients of thermal expansion from the heat source, heat sink, and attachments which are generally made of metal can be suppressed, so that thermal stress applied to the main conductors 24 and the auxiliary conductors 26 can be lowered. And, where the unified structure 28 shown in FIG. 3 is used, carbon or metal can be used to form such a unified structure. By using metal, differences in coefficient of thermal conductivity can be suppressed, and thermal stress can be lowered. To achieve the main conductors 24, it is necessary to choose a material to provide flexibility. When the main conductors 24 or the auxiliary conductors 26 are made of metal, it is preferable to use aluminum, silver, gold, titanium, magnesium, or the like. Carbon fibers with orientations of $0°/90°$ or $0°/+60°/-60°$ or carbon plates formed by laminating carbon foils can also be used for the main conductors 24 and the auxiliary conductors 26.

Figure 8:
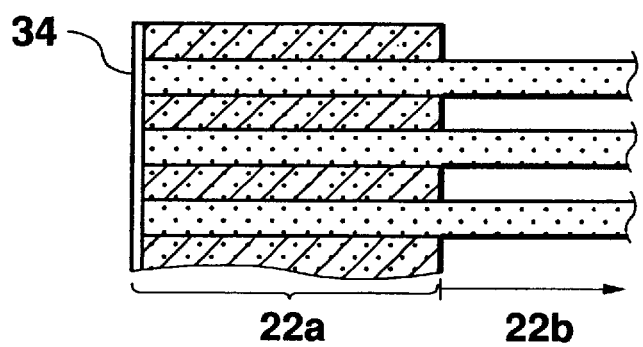
FIG. 8 is a partially cutaway sectional view showing an example that a metal film is used with the structure of FIG. 2.
Figure 9:
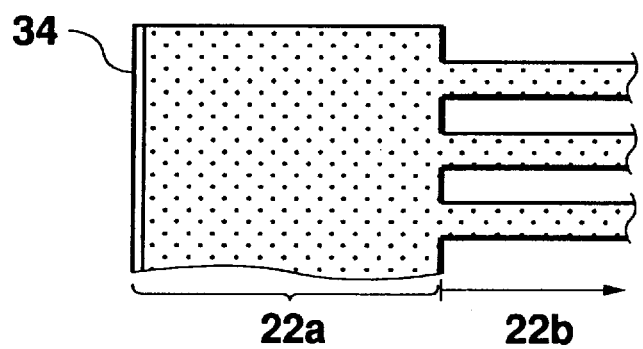
FIG. 9 is a partially cutaway sectional view showing an example that a metal film is used with the structure of FIG. 3.
Figure 10:
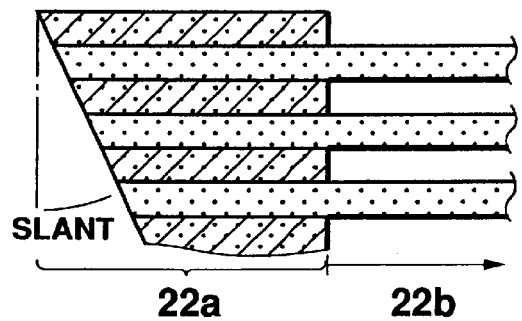
FIG. 10 is a partially cutaway sectional view showing an example that a slant face is used with the structure of FIG. 2.
Figure 11:
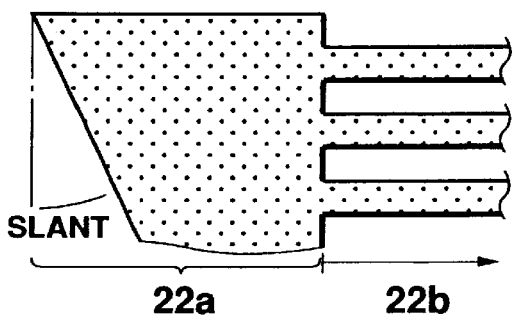
FIG. 11 is a partially cutaway sectional view showing an example that a slant face is used with the structure of FIG. 3.
Figure 12:
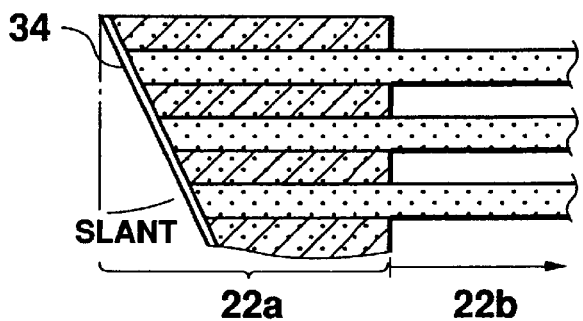
FIG. 12 is a partially cutaway sectional view showing an example that a slant face is used with the structure of FIG. 10.
Figure 13:
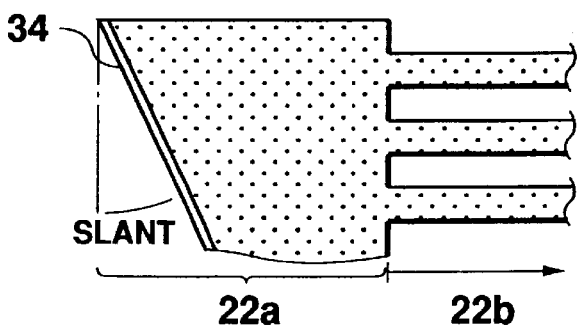
FIG. 13 is a partially cutaway sectional view showing an example that a slant face is used with the structure of FIG. 11.

FIG. 8 through FIG. 13 show modified forms of the structure of the interface portion 22a. FIG. 8 and FIG. 9 show that a metal film 34 is applied to the structures shown in FIG. 2. and FIG. 3 on the side facing the heat source or the heat sink. FIG. 10 and FIG. 11 show that a slant face (SLANT in the drawings) is used with the structures shown in FIG. 2. and FIG. 3 on the side facing the heat source or the heat sink. FIG. 12 and FIG. 13 show that the metal film 34 is applied by depositing or coating to the structures shown in FIG. 10 and FIG. 11 on the side facing the heat source or the heat sink. It is to be understood that for purposes of clarify in the drawings, the thickness of the metal film 34 and the slant angle are exaggerated, namely they are shown in larger than actual size. Among the modifications shown in the above drawings, the metal film 34 eliminates the need for an adhesive agent (the adhesive agent 16 in the prior art) which is also used to fix the thermal conductor 22 to the heat source or the heat sink. In other words, by fusing the surface of metal forming the metal film 34 or by disposing another type of metal in a fused state on the metal film 34, the thermal conductor 22 can be meltbonded to the heat source or heat sink which is generally made of metal, eliminating needed for an adhesive agent. Generally, an adhesive agent has a thermal conductivity lower than that of metal or carbon, so that, by eliminating the use of an adhesive agent, thermal resistance between the heat source or heat sink and the thermal conductor 22 can be lowered. The slant face also serves to increase the area of the side facing the heat source or the heat sink, namely the area of the source or sink interface face, thereby lowering thermal resistance.

Figure 14:
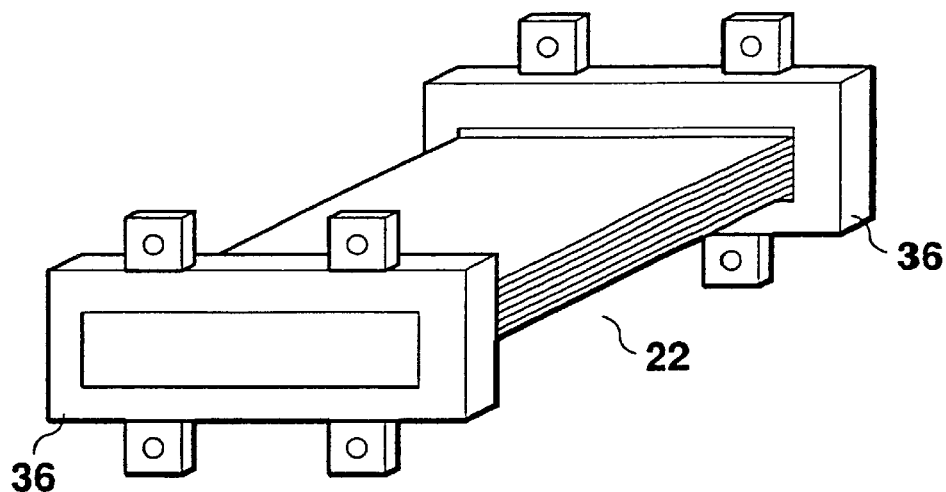
FIG. 14 is a perspective view showing the appearance of a thermal joint with attachments fixed according to a preferred embodiment of the invention.
Figure 15:
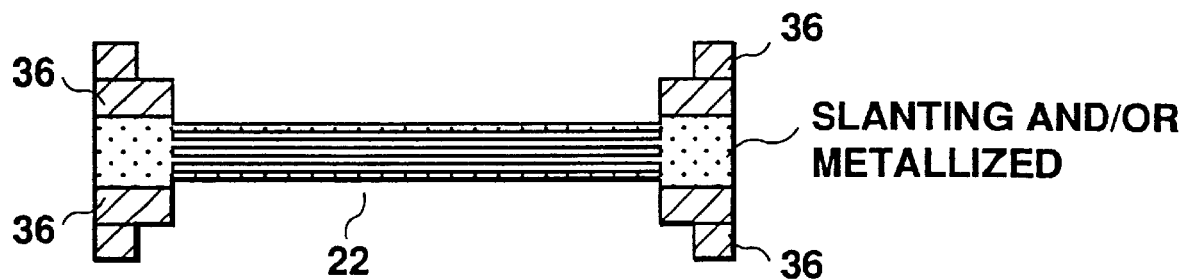
FIG. 15 is a sectional view taken on line A—A of FIG. 14.
Figure 16:
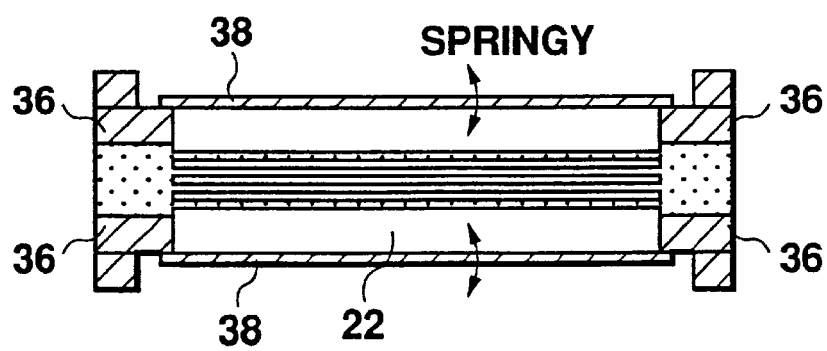
FIG. 16 is a sectional view showing the structure of FIG. 15 with a reinforcing support.
Figure 17:
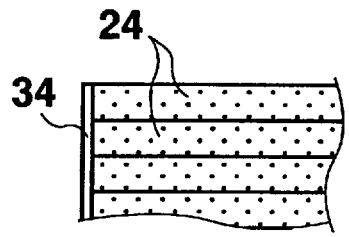
FIG. 17 is a partially cutaway sectional view showing the structure of FIG. 8 from which the auxiliary conductor is removed.
Figure 21:
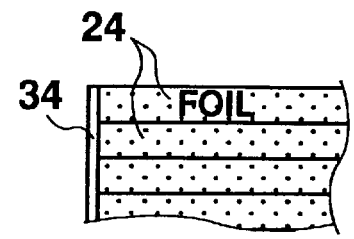
FIG. 21 is a partially cutaway sectional view showing the structure of FIG. 17 with the main conductor replaced by foils.
Figure 18:
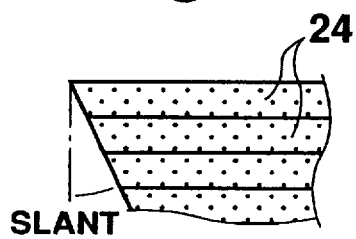
FIG. 18 is a partially cutaway sectional view showing the structure of FIG. 10 from which the auxiliary conductor is removed.
Figure 22:
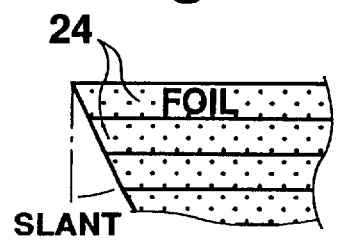
FIG. 22 is a partially cutaway sectional view showing the structure of FIG. 18 with the main conductor replaced by foils.
Figure 19:
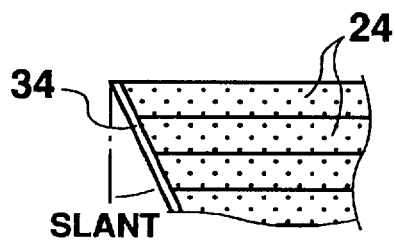
FIG. 19 is a partially cutaway sectional view showing the structure of FIG. 12 from which the auxiliary conductor is removed.
Figure 23:
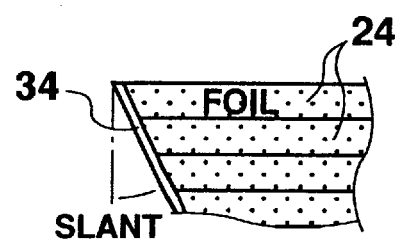
FIG. 23 is a partially cutaway sectional view showing the structure of FIG. 19 with the main conductor replaced by foils.
Figure 20:
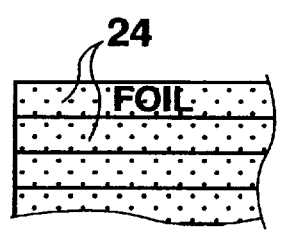
FIG. 20 is a partially cutaway sectional view showing the structure of FIG. 2 with the auxiliary conductor removed and the main conductor replaced bv foils.
Figure 24:
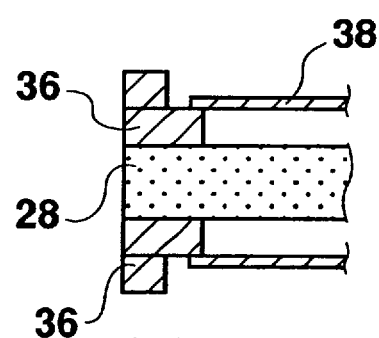
FIG. 24 is a partially sectional view showing the structure with the auxiliary conductor removed or the main conductor replaced by foils and a reinforcing support provided.
Figure 25:
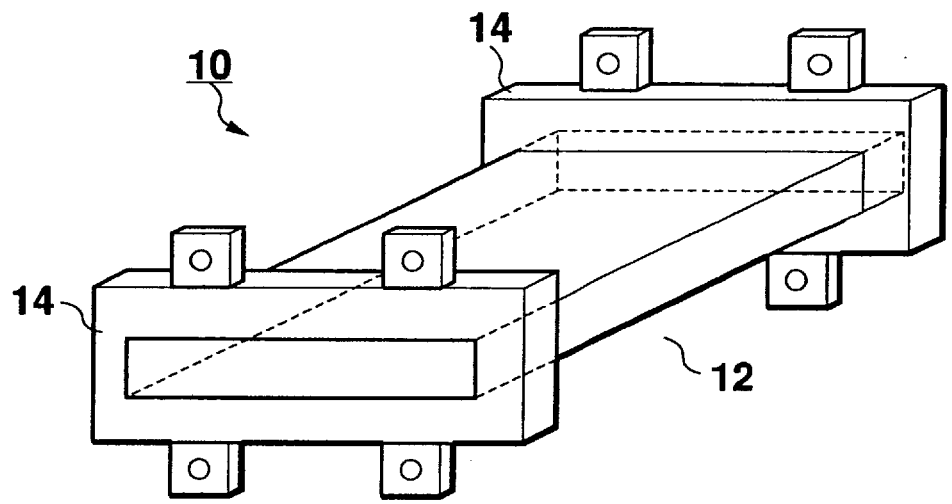
FIG. 25 is a perspective view showing the appearance of a thermal joint according to prior art.
Figure 26:
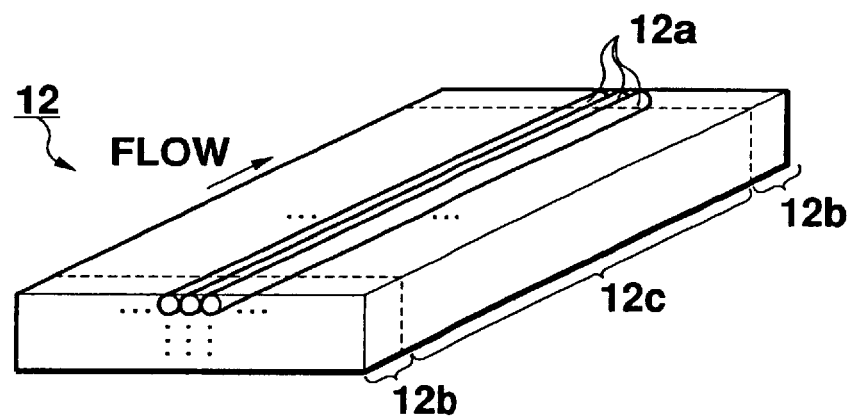
FIG. 26 is a perspective view showing the appearance and inside structure of the thermal joint according to the prior art of FIG. 25.
Figure 27:
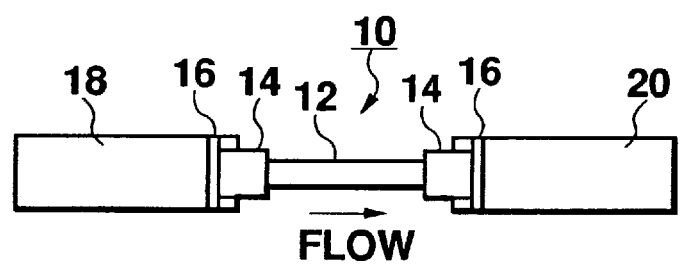
FIG. 27 and FIG. 28 are views showing examples of using the thermal joint according to the prior art of FIG. 25.
Figure 28:
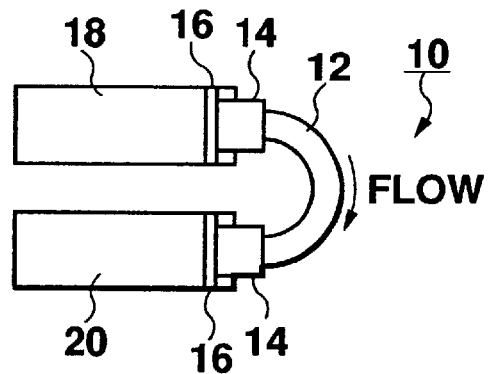

FIG. 14 th rough FIG. 16 show that attachments 36 are fixed to the interface portions 22a of the thermal conductor 22. The attachments 36 may have the same structure as the attachments 14 according to the prior art. In FIG. 16, reference numeral 38 denotes a reinforcing material. The reinforcing material 38 is a plate or cylindrical member formed of a flexible carbon fiber plate, carbon plate or metal plate, and bridges from one to the other of the two attachments 36. By providing the reinforcing material 38 as described above, the major portion of a load which might be applied from the attachments 36 to the terminal conductor 22, particularly to the main conductor 24, due to bending or heat, is applied to the reinforcing material 38. As a result, the thermal conductor 22 is not easily broken by a load.

FIGS. 17 to 24 show a modification in which the foils are used as main conductors 24 and the auxiliary conductors 26 are eliminated. Especially, in FIGS. 17, 19, 21 and 23 a metal film 34 is provided, in FIGS. 18, 19, 22 and 23 a slanting face is provided, and in FIG. 24 a supporting structure is provided. In the structures with foils shown in these figures, the mechanical strength is enhanced and the thermal resistance is lowered.

While there have been described that what are at present considered to be preferred embodiments of the invention, it is to be understood that various modifications may be made thereto, and it is intended that the appended claims cover all such modifications as fall within the true spirit and scope of the invention.

What is claimed is:

1. A thermal joint for performing a heat transfer between external substances, comprising:

a plurality of main conductors for performing transfer and having flexibility in a direction crossing a direction of heat transfer, said main conductor having first and second interface portions to provide a path for heat conduction between said external substances and said main conductor;

a plurality of auxiliary conductors for providing an additional and separate path for heat conduction between said external substances and said plurality of main conductors; and a laminated structure formed by alternately disposing said main conductors and said auxiliary conductors at said interface portions in a direction crossing said direction of heat transfer, wherein said plurality of main conductors are arranged in parallel to one another and extend from said first interface portion to said second interface portion which are at respective ends of said plurality of main conductors, and wherein said plurality of auxiliary conductors space apart respective ones of said plurality of main conductors, said spacing being maintained as a substantial uniform gap between said main conductors between said first and second interface portions.

2. The thermal joint according to claim 1, wherein said main conductors and auxiliary conductors are made of one member selected from a group consisting of bundled fibers formed by bundling a plurality of fibers having a thermal conductivity, a resin plate produced by adhering said bundled fibers with a resin, thermal threads formed by twining said plurality of fibers, thermal fabrics formed by weaving said plurality of fibers into other fibers, thermal braided fibers formed by interweaving said plurality of fibers, thermal foils having a thermal conductivity, or thermal plates having a thermal conductivity; and said fibers, thermal foils, or thermal plates are formed of either carbon or metal.

3. The thermal joint according to claim 1, further comprising a slanting face where at least one of said main conductor and said auxiliary conductor conducts heat from or to said external substances and is cut slantwise with respect to said direction of heat transfer.

4. The thermal joint according to claim 1, further comprising a metallized face where at least one of said main conductor and said auxiliary conductor conducts heat from or to said external substances.

5. The thermal joint according to claim 3, wherein said slanting face is metallized.

6. The thermal joint according to claim 1, further comprising:

a reinforcing member being flexible in a direction substantially parallel to the direction that said plurality of main conductors are flexible; and a member for attaching said reinforcing member to said plurality of main conductors and said plurality of auxiliary conductors to bridge from one to the other of said interface portions, said member separating said reinforcing member from said plurality of main conductors.

7. A thermal joint for performing a heat transfer between external substances, comprising:

a plurality of main conductors for performing transfer and having flexibility in a direction crossing a direction of heat transfer, said main conductor having first and second interface portions to provide a path for heat conduction between said external substances and said main conductor;

a plurality of auxiliary conductors for providing an additional and separate path for heat conduction between said external substances and said plurality of main conductors;

a unified structure of said main conductors and said auxiliary conductors unified at said interface portions;

wherein said plurality of main conductors are arranged in parallel to one another and extend from said first interface portion to said second interface portion which are at respective ends of said plurality of main conductors, and wherein said plurality of auxiliary conductors space apart respective ones of said plurality of main conductors, said spacing being maintained as a substantial uniform gap between said main conductors between said first and second interface portions.

8. The thermal joint according to claim 7, wherein said main conductors are made of one member selected from a group consisting of bundled fibers formed by bundling a plurality of fibers having a thermal conductivity, a resin plate produced by adhering said bundled fibers with a resin, thermal threads formed by twining said plurality of fibers, thermal fabrics formed by weaving said plurality of fibers into other fibers, thermal braided fibers formed by interweaving said plurality of fibers, thermal foils having a thermal conductivity, or thermal plates having a thermal conductivity;

said auxiliary conductors are bulk-formed products for fixing said main conductors with each other at said interface portions to form spaces between said main conductors in a direction crossing said direction of heat transfer; and said fibers, thermal foils, or bulk-formed products are formed of either carbon or metal.

9. The thermal joint according to claim 7, further comprising:
a reinforcing member being flexible in a direction substantially parallel to the direction that said plurality of main conductors are flexible; and
a member for attaching said reinforcing member to said plurality of main conductors and said plurality of auxiliary conductors to bridge from one to the other of said interface portions, said member separating said reinforcing member from said plurality of main conductors.

* * * * *